US012665006B2

(12) United States Patent
Fu et al.

(10) Patent No.: US 12,665,006 B2
(45) Date of Patent: Jun. 23, 2026

(54) STOP READ GO SETTINGS FOR LOW SUSPEND LATENCY APPLICATIONS

(71) Applicant: Sandisk Technologies, Inc., Milpitas, CA (US)

(72) Inventors: Jing Fu, Shanghai (CN); Weikai Xu, San Jose, CA (US); Qianqian Li, Shanghai (CN); Sumner Xia, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 310 days.

(21) Appl. No.: 18/230,832

(22) Filed: Aug. 7, 2023

(65) Prior Publication Data

US 2024/0428834 A1 Dec. 26, 2024

Related U.S. Application Data

(60) Provisional application No. 63/522,492, filed on Jun. 22, 2023.

(51) Int. Cl.
*G11C 7/22* (2006.01)
*G11C 16/10* (2006.01)

(52) U.S. Cl.
CPC ............... *G11C 7/22* (2013.01); *G11C 16/10* (2013.01)

(58) Field of Classification Search
CPC ....................................................... G11C 7/22
See application file for complete search history.

(56) References Cited

U.S. PATENT DOCUMENTS

| | | | |
|---|---|---|---|
| 9,892,794 B2 | 2/2018 | Micheloni et al. | |
| 10,490,290 B2 | 11/2019 | Kondo | |
| 10,956,081 B2 | 3/2021 | Pelster et al. | |
| 11,307,794 B2 | 4/2022 | Ji et al. | |
| 11,355,208 B2 | 6/2022 | Lien et al. | |
| 2019/0057742 A1* | 2/2019 | Jeon ................... | G06F 13/1642 |
| 2022/0101927 A1 | 3/2022 | Madraswala et al. | |

* cited by examiner

*Primary Examiner* — Amir Zarabian
*Assistant Examiner* — Anthony Thinh Tang
(74) *Attorney, Agent, or Firm* — Dickinson Wright PLLC

(57) ABSTRACT

Each Stop Read Go (SRG) setting has different latency and reliability issues. An aspect of the present disclosure is related to minimizing these reliability risks while maintaining the benefit of low suspend latency when implementing SRG.

6 Claims, 19 Drawing Sheets

Figure 18:
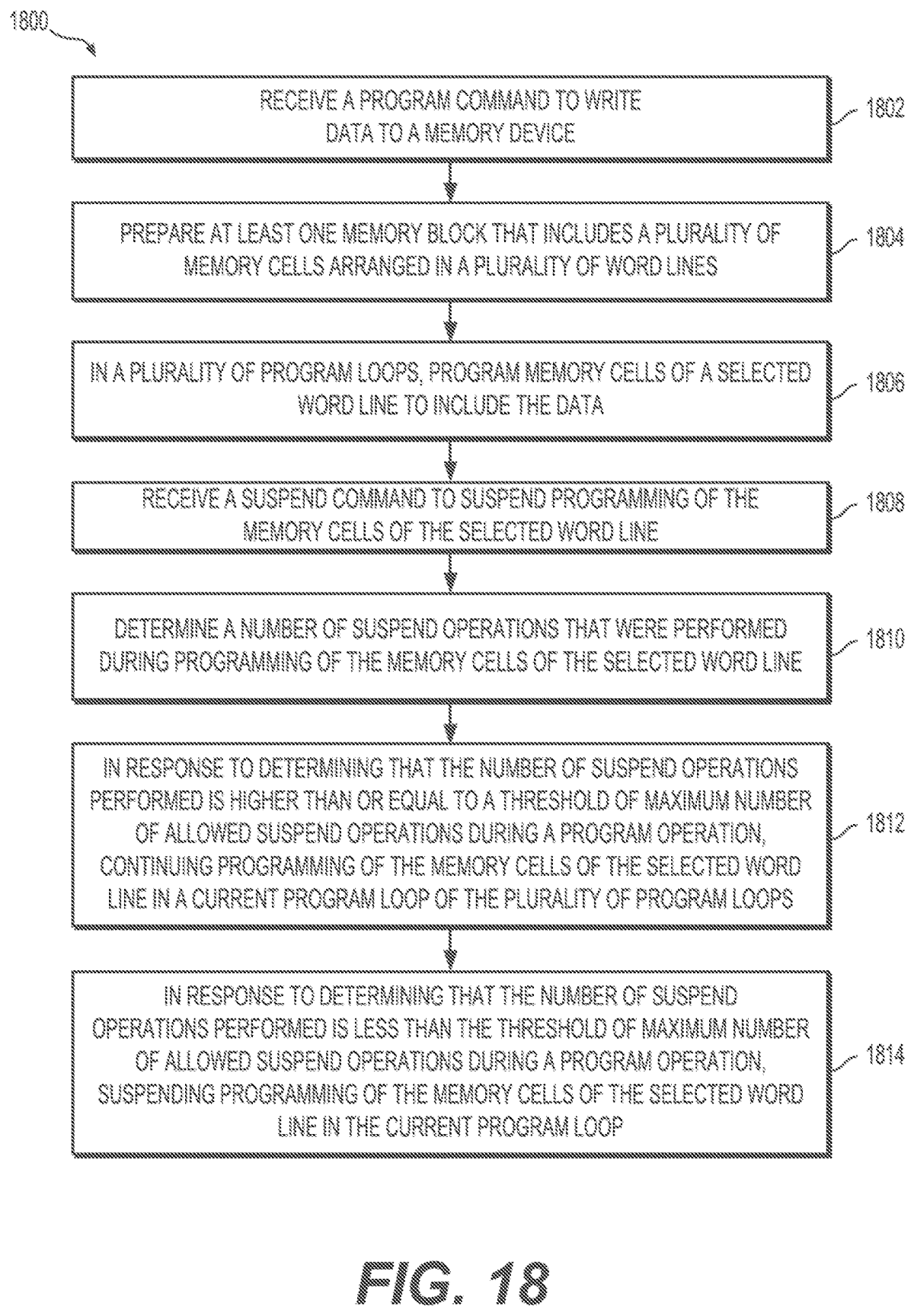

1800

```
┌─────────────────────────────────────────────────────────────┐
│           RECEIVE A PROGRAM COMMAND TO WRITE                  │──── 1802
│              DATA TO A MEMORY DEVICE                          │
└─────────────────────────────────────────────────────────────┘
                            │
                            ▼
┌─────────────────────────────────────────────────────────────┐
│   PREPARE AT LEAST ONE MEMORY BLOCK THAT INCLUDES A PLURALITY │──── 1804
│    OF MEMORY CELLS ARRANGED IN A PLURALITY OF WORD LINES      │
└─────────────────────────────────────────────────────────────┘
                            │
                            ▼
┌─────────────────────────────────────────────────────────────┐
│  IN A PLURALITY OF PROGRAM LOOPS, PROGRAM MEMORY CELLS OF A   │──── 1806
│         SELECTED WORD LINE TO INCLUDE THE DATA               │
└─────────────────────────────────────────────────────────────┘
                            │
                            ▼
┌─────────────────────────────────────────────────────────────┐
│   RECEIVE A SUSPEND COMMAND TO SUSPEND PROGRAMMING OF THE     │──── 1808
│        MEMORY CELLS OF THE SELECTED WORD LINE               │
└─────────────────────────────────────────────────────────────┘
                            │
                            ▼
┌─────────────────────────────────────────────────────────────┐
│  DETERMINE A NUMBER OF SUSPEND OPERATIONS THAT WERE PERFORMED │──── 1810
│  DURING PROGRAMMING OF THE MEMORY CELLS OF THE SELECTED WORD  │
│                          LINE                                │
└─────────────────────────────────────────────────────────────┘
                            │
                            ▼
┌─────────────────────────────────────────────────────────────┐
│  IN RESPONSE TO DETERMINING THAT THE NUMBER OF SUSPEND        │
│  OPERATIONS PERFORMED IS HIGHER THAN OR EQUAL TO A THRESHOLD  │
│  OF MAXIMUM NUMBER OF ALLOWED SUSPEND OPERATIONS DURING A     │──── 1812
│  PROGRAM OPERATION, CONTINUING PROGRAMMING OF THE MEMORY      │
│  CELLS OF THE SELECTED WORD LINE IN A CURRENT PROGRAM LOOP    │
│  OF THE PLURALITY OF PROGRAM LOOPS                            │
└─────────────────────────────────────────────────────────────┘
                            │
                            ▼
┌─────────────────────────────────────────────────────────────┐
│  IN RESPONSE TO DETERMINING THAT THE NUMBER OF SUSPEND        │
│  OPERATIONS PERFORMED IS LESS THAN THE THRESHOLD OF MAXIMUM   │
│  NUMBER OF ALLOWED SUSPEND OPERATIONS DURING A PROGRAM        │──── 1814
│  OPERATION, SUSPENDING PROGRAMMING OF THE MEMORY CELLS OF     │
│  THE SELECTED WORD LINE IN THE CURRENT PROGRAM LOOP          │
└─────────────────────────────────────────────────────────────┘
```

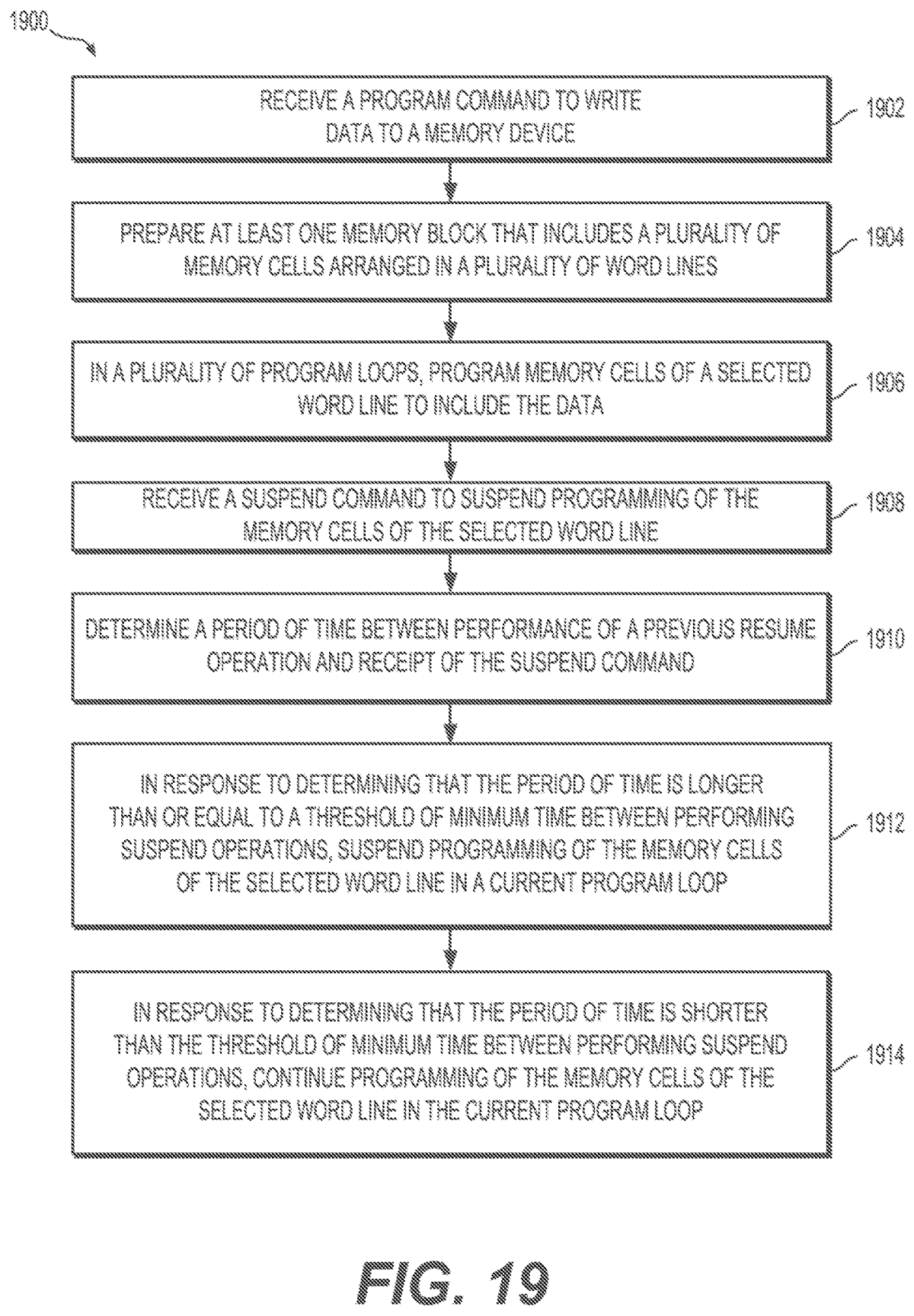

```
┌────────────────────────────────────────────────────────┐
│          RECEIVE A PROGRAM COMMAND TO WRITE             │──── 1902
│             DATA TO A MEMORY DEVICE                     │
└────────────────────────────────────────────────────────┘
                          │
                          ▼
┌────────────────────────────────────────────────────────┐
│  PREPARE AT LEAST ONE MEMORY BLOCK THAT INCLUDES A       │──── 1904
│  PLURALITY OF MEMORY CELLS ARRANGED IN A PLURALITY       │
│  OF WORD LINES                                           │
└────────────────────────────────────────────────────────┘
                          │
                          ▼
┌────────────────────────────────────────────────────────┐
│  IN A PLURALITY OF PROGRAM LOOPS, PROGRAM MEMORY         │──── 1906
│  CELLS OF A SELECTED WORD LINE TO INCLUDE THE DATA       │
└────────────────────────────────────────────────────────┘
                          │
                          ▼
┌────────────────────────────────────────────────────────┐
│  RECEIVE A SUSPEND COMMAND TO SUSPEND PROGRAMMING        │──── 1908
│  OF THE MEMORY CELLS OF THE SELECTED WORD LINE           │
└────────────────────────────────────────────────────────┘
                          │
                          ▼
┌────────────────────────────────────────────────────────┐
│  DETERMINE A PERIOD OF TIME BETWEEN PERFORMANCE OF A     │──── 1910
│  PREVIOUS RESUME OPERATION AND RECEIPT OF THE SUSPEND    │
│  COMMAND                                                 │
└────────────────────────────────────────────────────────┘
                          │
                          ▼
┌────────────────────────────────────────────────────────┐
│  IN RESPONSE TO DETERMINING THAT THE PERIOD OF TIME IS   │
│  LONGER THAN OR EQUAL TO A THRESHOLD OF MINIMUM TIME     │──── 1912
│  BETWEEN PERFORMING SUSPEND OPERATIONS, SUSPEND          │
│  PROGRAMMING OF THE MEMORY CELLS OF THE SELECTED         │
│  WORD LINE IN A CURRENT PROGRAM LOOP                     │
└────────────────────────────────────────────────────────┘
                          │
                          ▼
┌────────────────────────────────────────────────────────┐
│  IN RESPONSE TO DETERMINING THAT THE PERIOD OF TIME IS   │
│  SHORTER THAN THE THRESHOLD OF MINIMUM TIME BETWEEN      │──── 1914
│  PERFORMING SUSPEND OPERATIONS, CONTINUE PROGRAMMING     │
│  OF THE MEMORY CELLS OF THE SELECTED WORD LINE IN THE    │
│  CURRENT PROGRAM LOOP                                    │
└────────────────────────────────────────────────────────┘
```

*FIG. 19*

STOP READ GO SETTINGS FOR LOW SUSPEND LATENCY APPLICATIONS

CROSS-REFERENCE TO RELATED APPLICATIONS

This application claims the benefit of U.S. Provisional Application No. 63/522,492, filed on Jun. 22, 2023. The entire disclosure of the application referenced above is incorporated herein by reference.

BACKGROUND

1. Field

The present disclosure is related generally to memory devices and more particularly to techniques for verifying the threshold voltages of memory cells during a programming operation.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

SUMMARY

One aspect of the present disclosure is related to a method of programming a memory device. The method comprises the steps of: receiving a program command to write data to the memory device: preparing at least one memory block that includes a plurality of memory cells arranged in a plurality of word lines: in a plurality of program loops, programming memory cells of a selected word line to include the data: receiving a suspend command to suspend programming of the memory cells of the selected word line: determining a number of suspend operations that were performed during programming of the memory cells of the selected word line: and in response to determining that the number of suspend operations performed is higher than or equal to a threshold of maximum number of allowed suspend operations during a program operation, continuing programming of the memory cells of the selected word line in a current program loop of the plurality of program loops.

According to another aspect of the present disclosure, a memory device, comprises: at least one memory block that includes a plurality of memory cells arranged in a plurality of word lines: and control circuitry configured to program the memory cells of the at least one memory block in a plurality of program loops. The control circuitry being configured to: receive a program command to write data to the memory device: prepare at least one memory block that includes a plurality of memory cells arranged in a plurality of word lines; in a plurality of program loops, program memory cells of a selected word line to include the data: receive a suspend command to suspend programming of the memory cells of the selected word line: determine a period of time between performance of a previous resume operation and receipt of the suspend command: and in response to determining that the period of time is longer than or equal to a threshold of minimum time between performing suspend operations, suspend programming of the memory cells of the selected word line in a current program loop.

According to another aspect of the present disclosure, an apparatus comprises: at least one memory block that includes a plurality of memory cells arranged in a plurality of word lines: and a programming means for programming user data into the plurality of memory cells and configured to program the memory cells of the at least one memory block in a plurality of program loops. The programming means is configured to: receive a program command to write data to a memory device: prepare at least one memory block that includes a plurality of memory cells arranged in a plurality of word lines; and in a plurality of program loops, program memory cells of a selected word line to include the data. The programming means further configured to during a highest data state program loop: determine if any suspend operations were performed during programming of the memory cells of the selected word line: in response to determining that one or more suspend operation were performed, verify highest data state memory cells of the memory cells of the selected word line: and in response to determining that no suspend operations were performed, program the highest data state memory cells without verifying the highest data state memory cells.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 18 depicts a method 1800 of limiting a number of suspends allowed during each word line/string program, in accordance with embodiments described herein: and FIG. 19 depicts a method 1900 of setting a minimum time period between suspend operations, in accordance with embodiments described herein.

DESCRIPTION OF THE ENABLING EMBODIMENTS

Typically, for memory devices, read operations are higher priority than erase or program operations. For example, a program will be stopped to perform a read. To help illustrate, during the program operation, a read operation is inserted. Programming is, however, not immediately stopped. There is a latency before the read starts. After the read, the program will resume. Therefore, Stop Read Go (SRG) latency between a read command being issued and a read operation being executed is critical for system performance. Generally, the shorter the latency the better.

During SRG, suspend latency is defined as the latency between sending of suspend command and the time a memory device is ready for suspend. In most of applications, less suspend latency is preferred. There are different settings for SRG. The settings may be identified by three features that are (1) how soon a suspend operation starts after a suspend command is received, (2) whether program verify is before suspend or after resume, and (3) what is the program voltage (VPGM) after resume. Each SRG setting has different latency and reliability issues. An aspect of the present disclosure is related to minimizing reliability risk while maintaining the benefit of low suspend latency when implementing SRG.

Figures 1A, 1B:
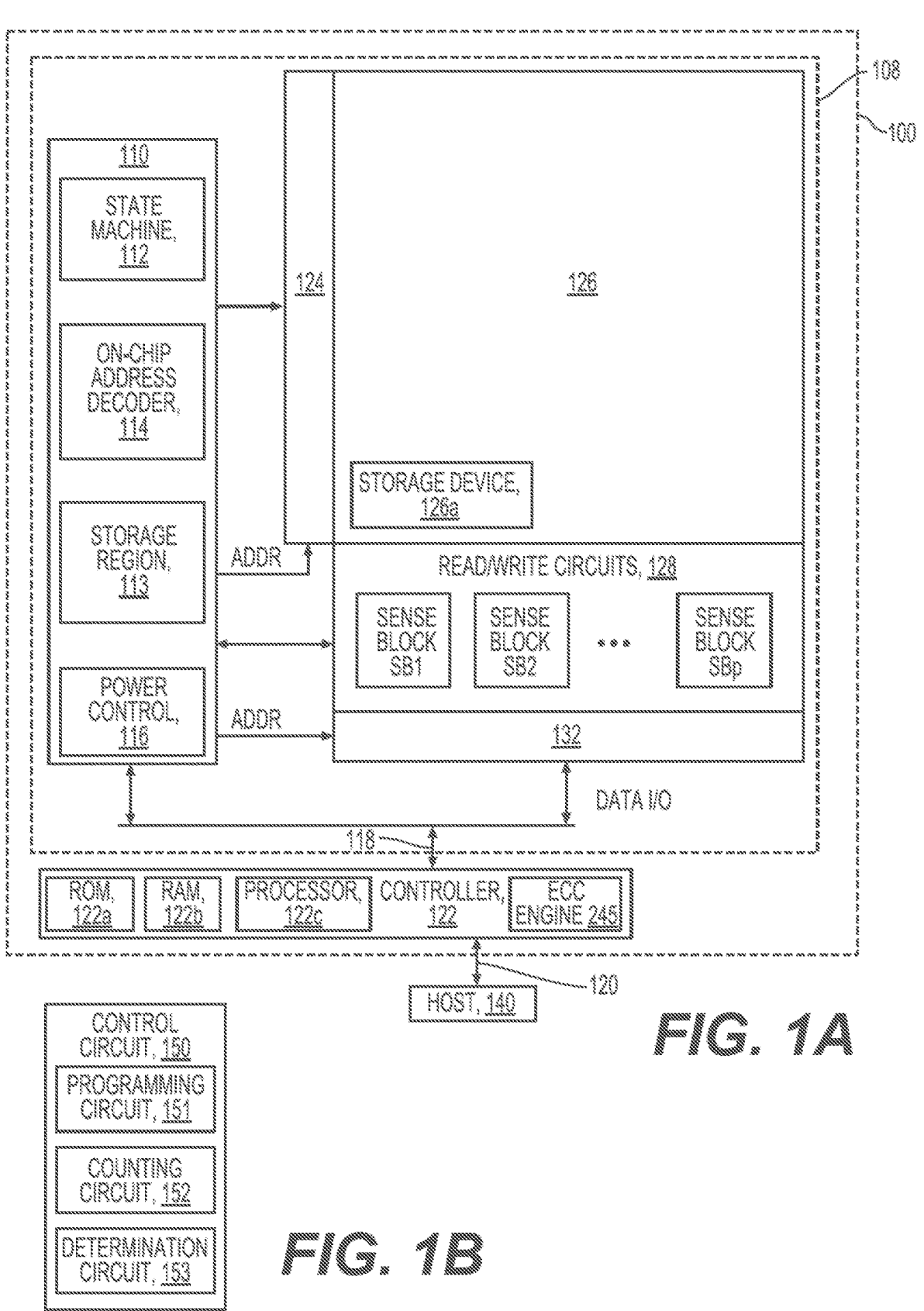
FIG. 1A is a block diagram of an example memory device.
FIG. 1B is a block diagram of an example control circuit.

FIG. 1A is a block diagram of an example memory device 100 is configured to operate according to the programming techniques of the present disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

For example, FIG. 1B is a block diagram of an example control circuit 150 which comprises a programming circuit 151, a counting circuit 152, and a determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
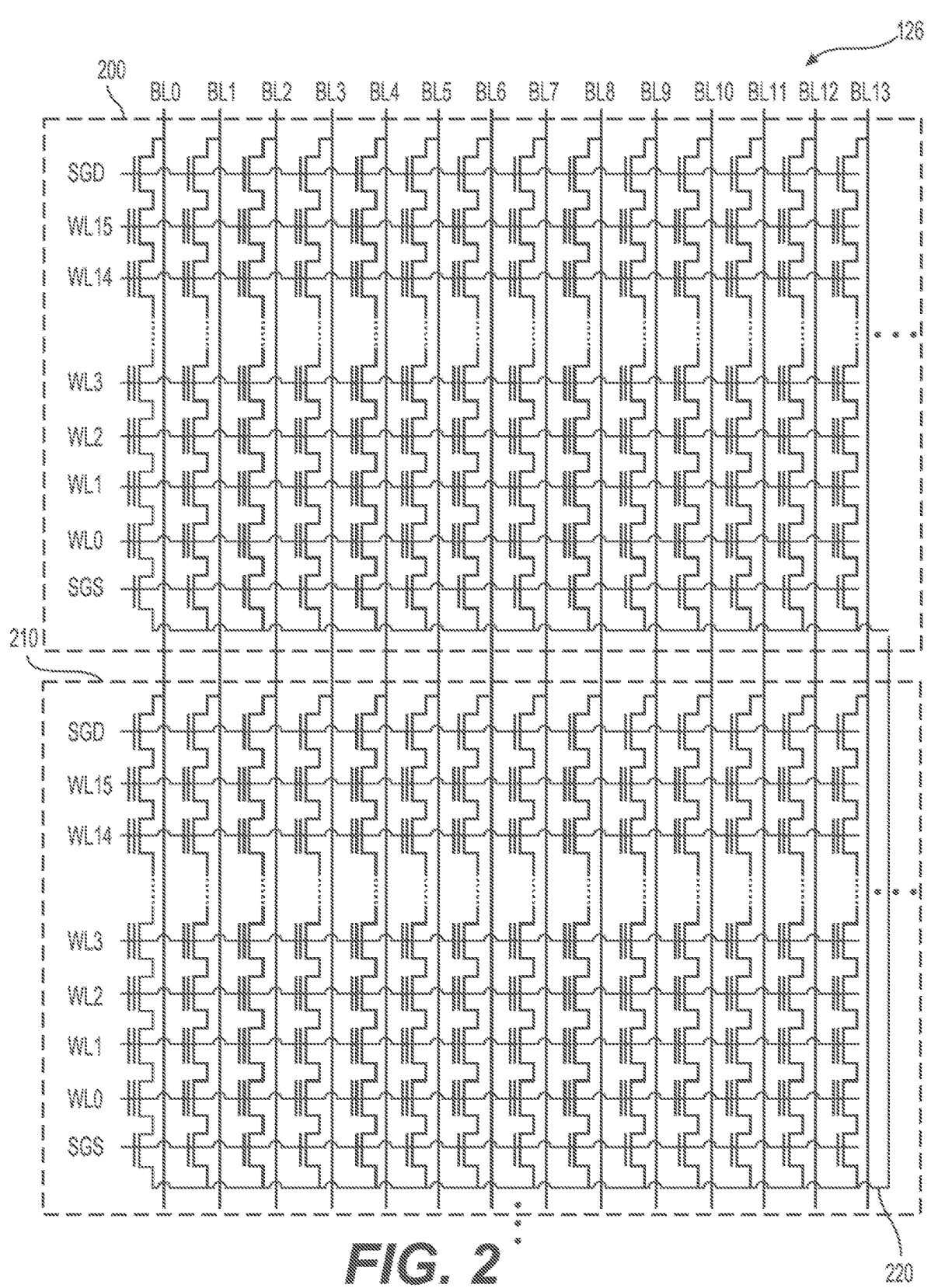
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
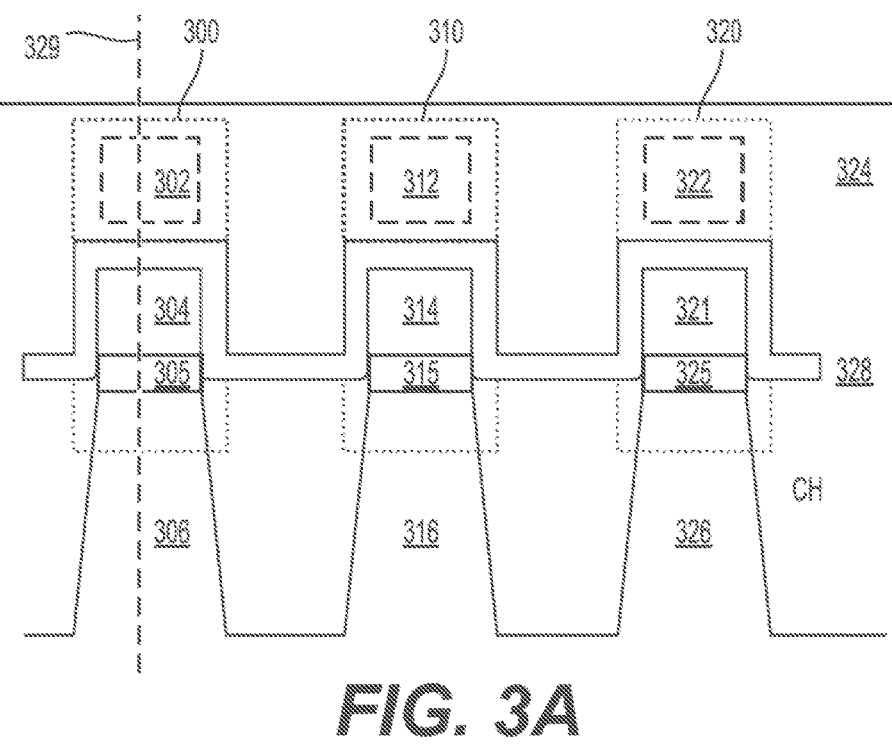
FIG. 3A and FIG. 3B depict cross-sectional views of example floating gate memory cells in NAND strings.
Figure 3B:
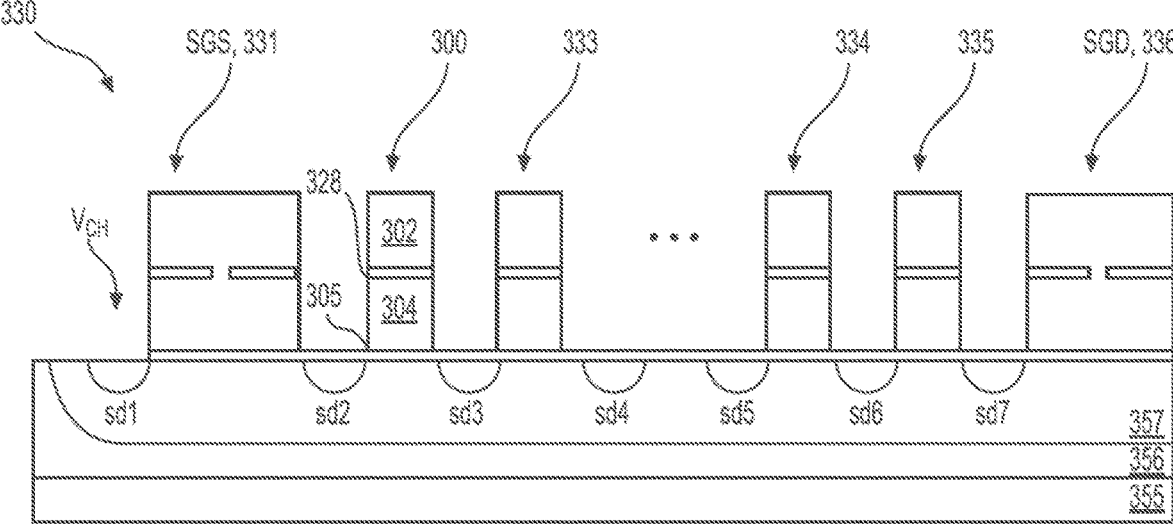

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
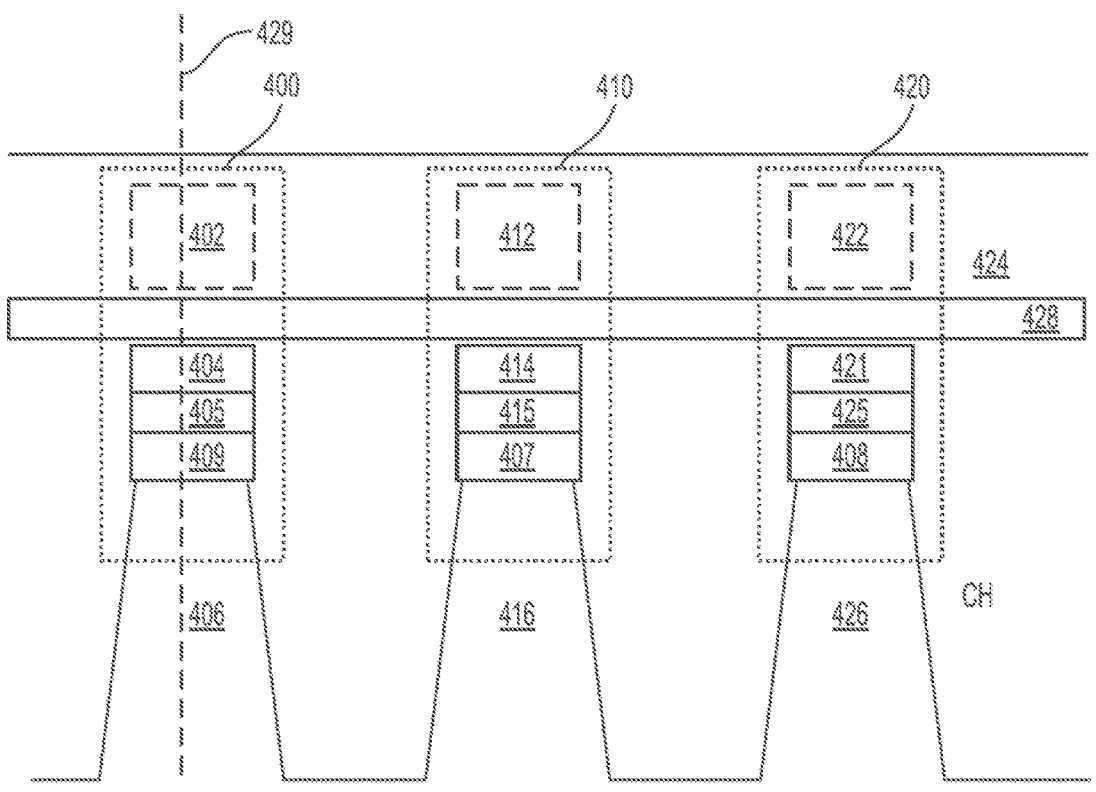
FIG. 4A and FIG. 4B depict cross-sectional views of example charge-trapping memory cells in NAND strings.
Figure 4B:
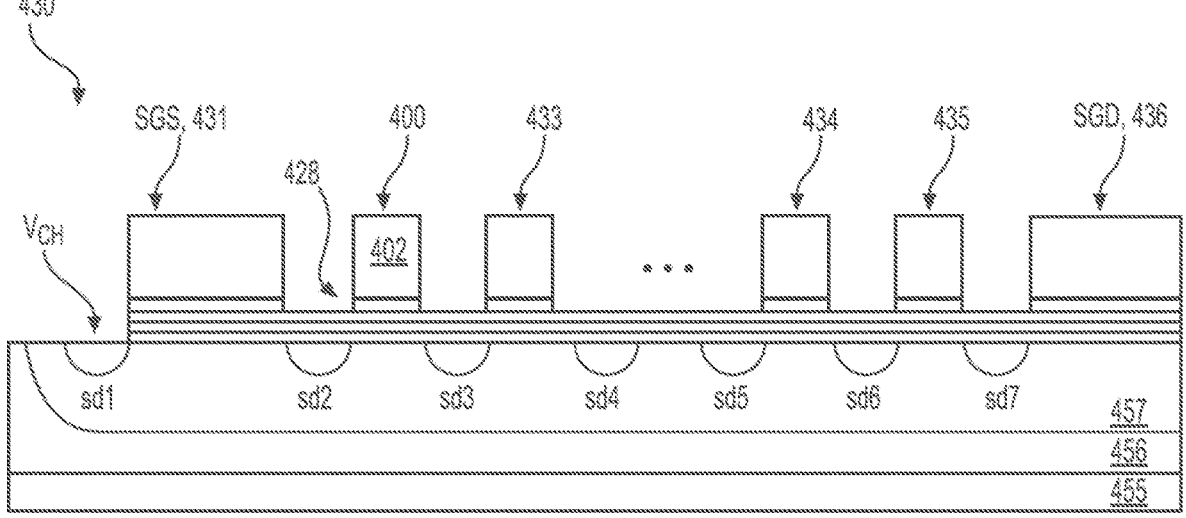

As an alternative, as shown in FIGS. 4A and 4B, the flat or planar memory cell 400, 410, 420 has been developed in which the control gate 402, 412, 422 is flat or planar: that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
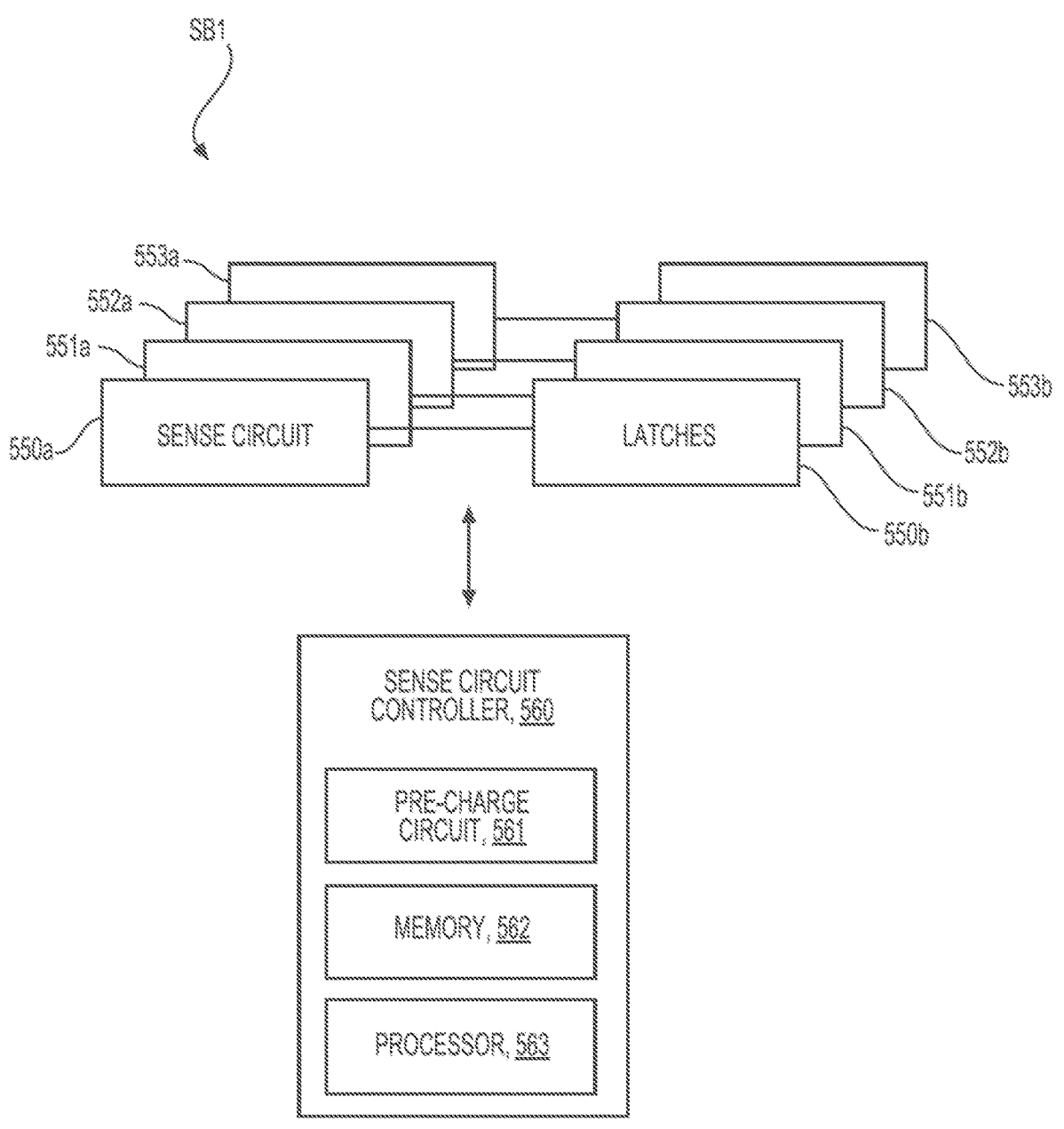
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
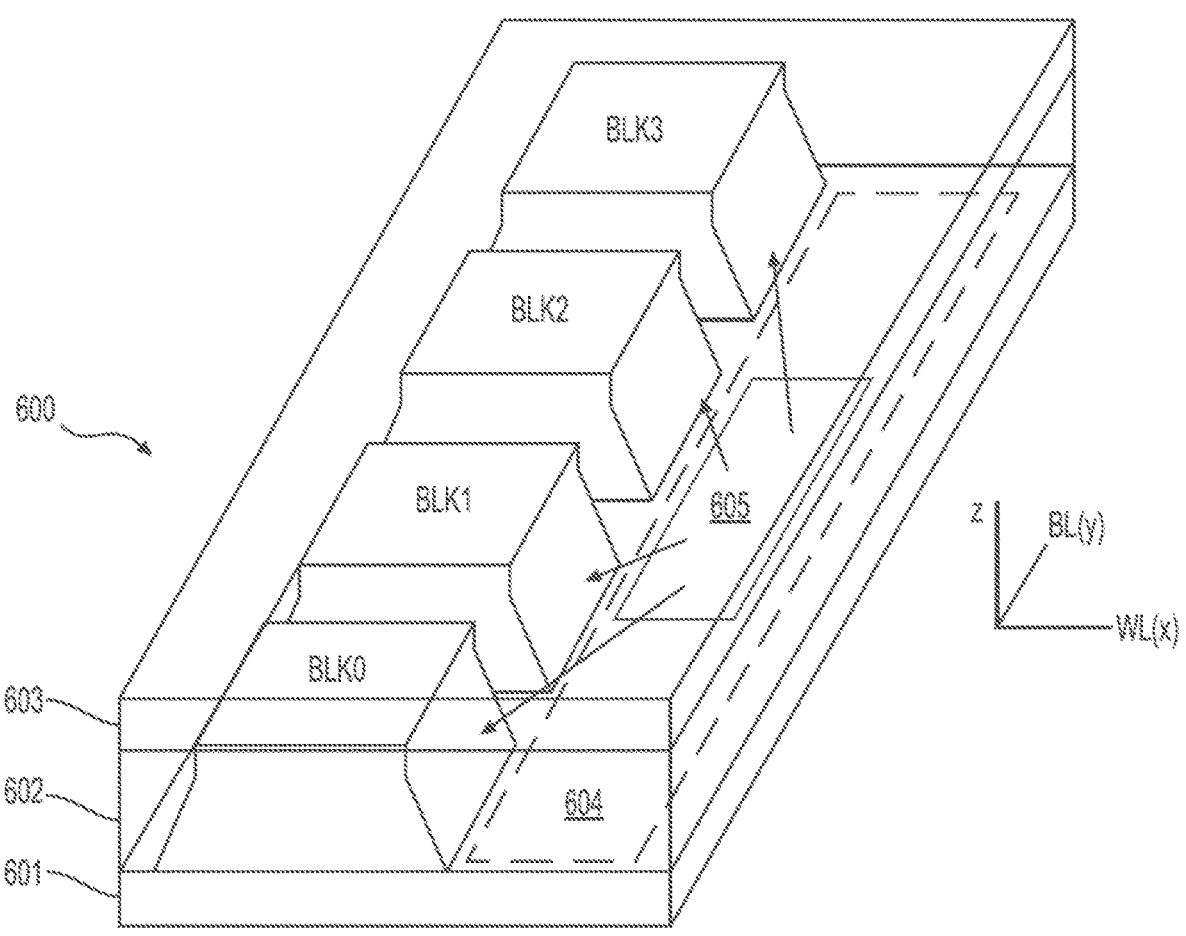
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
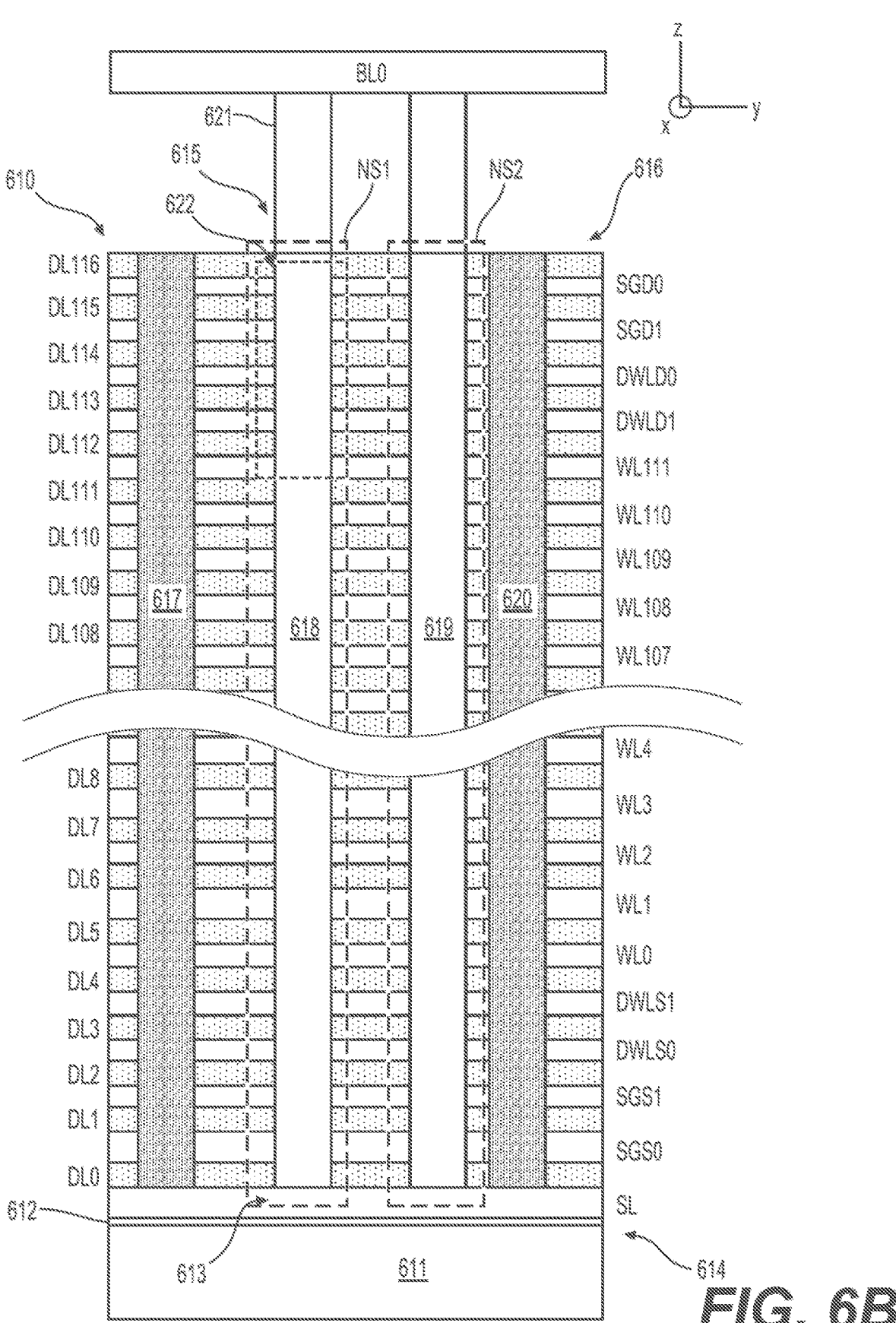
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as inter-connects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
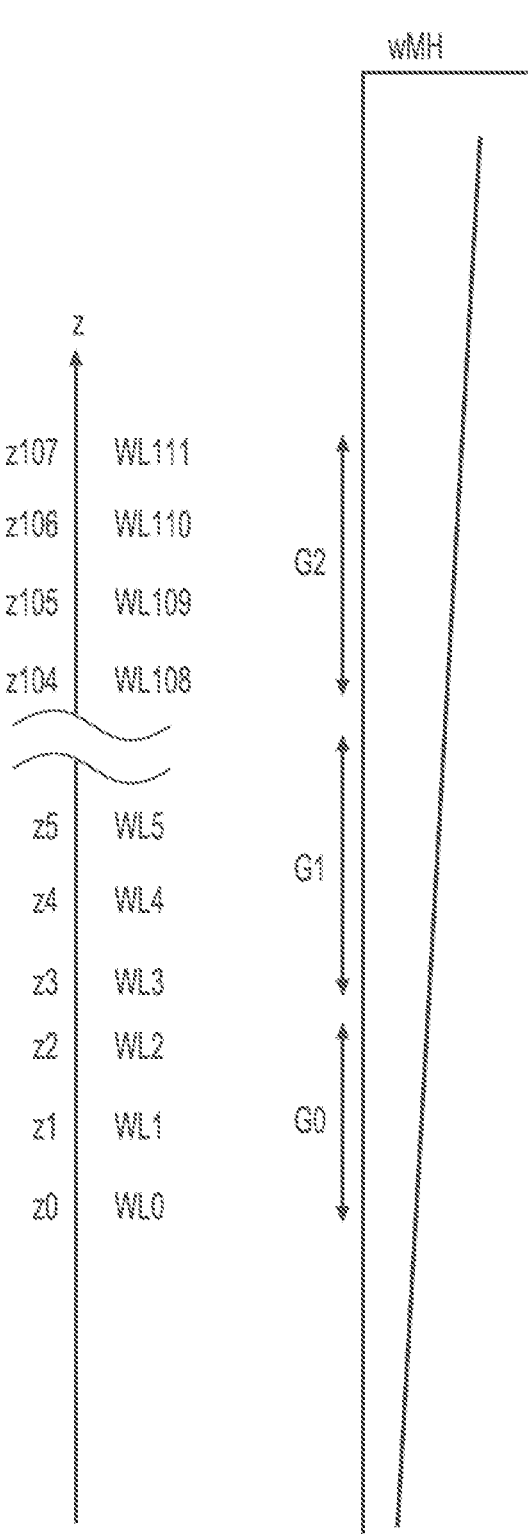
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
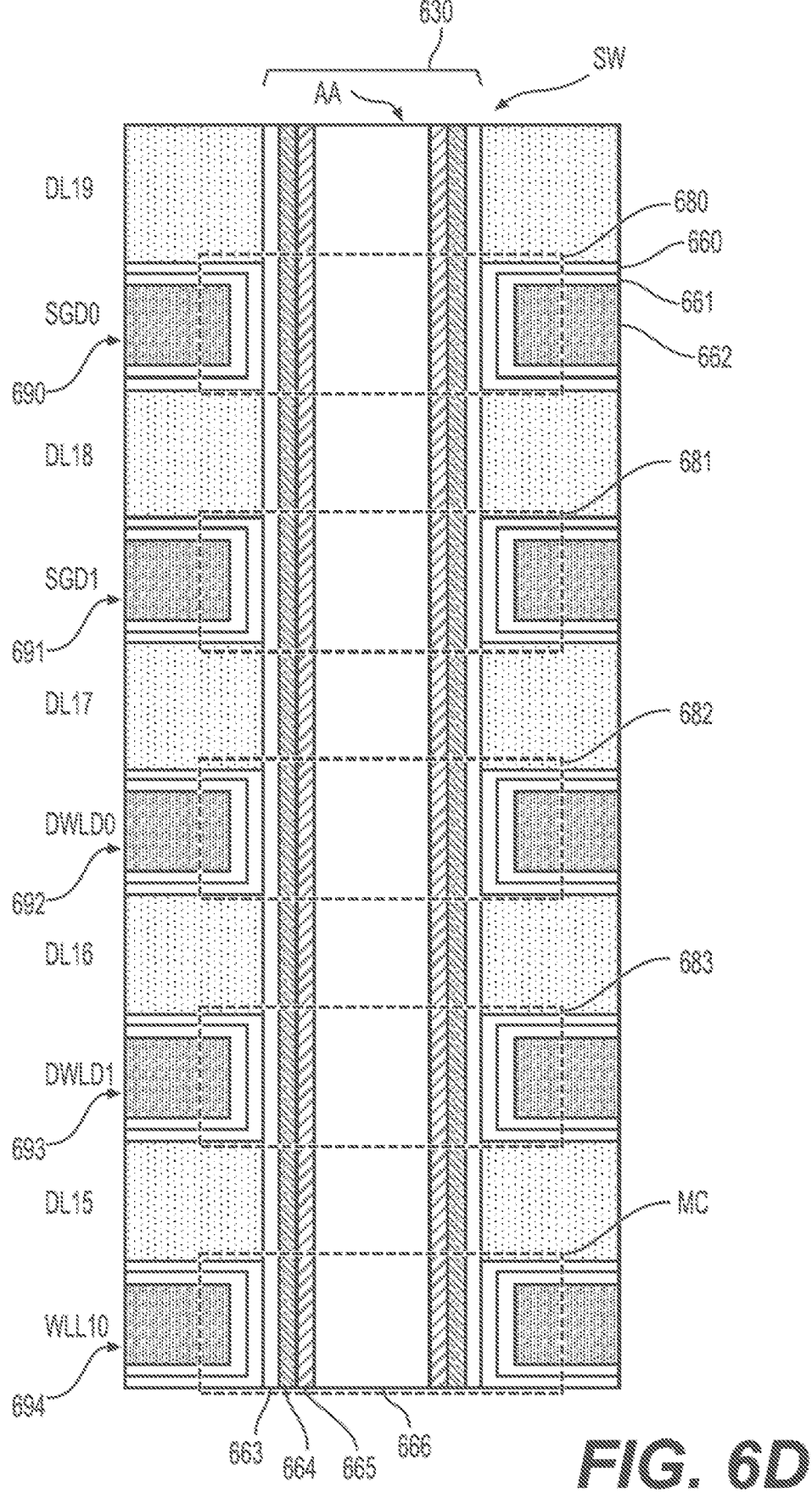
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
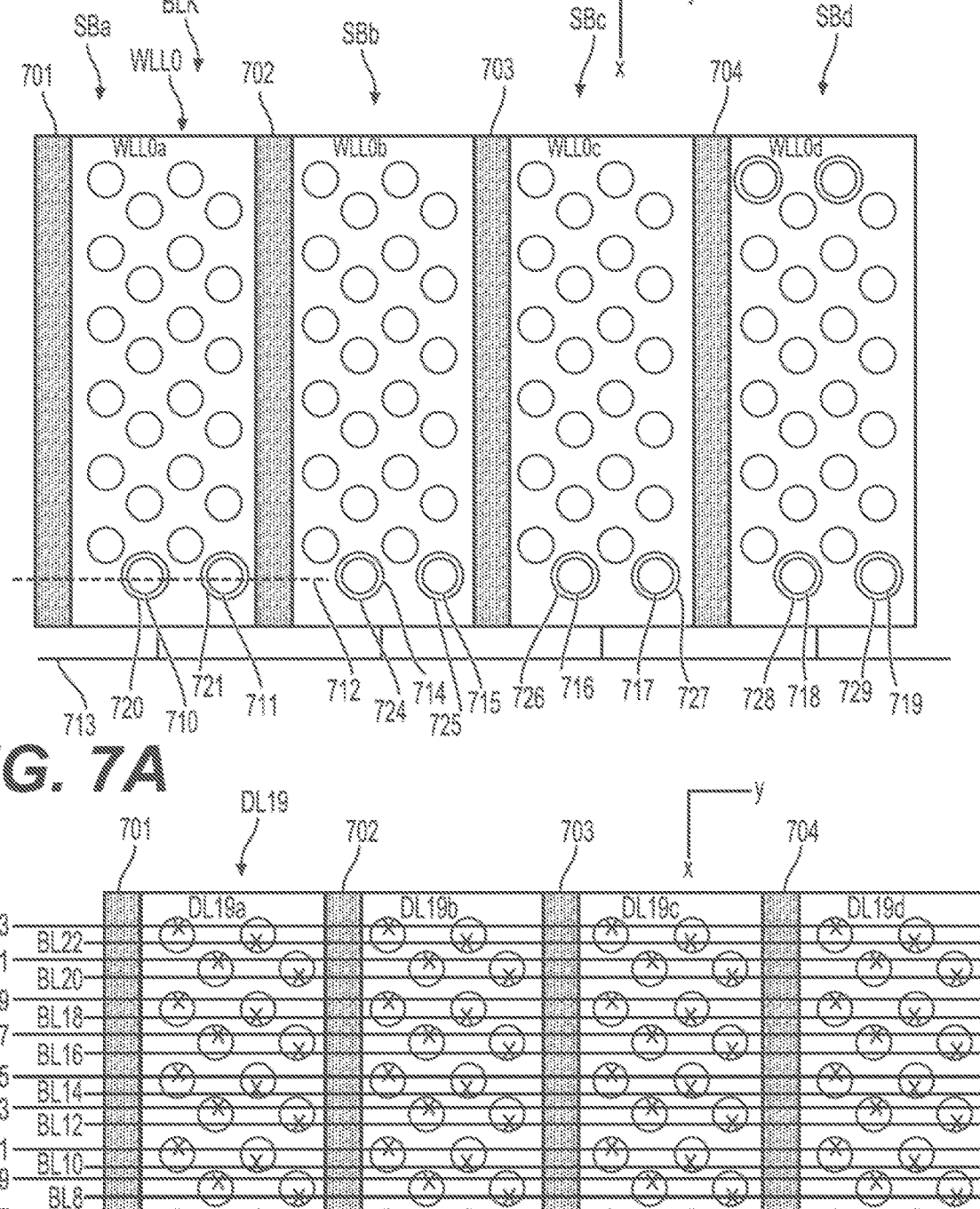
FIG. 7A depicts a top view of an example word line layer WLL0 of the stack of FIG. 6B.
FIG. 7B depicts a top view of an example top dielectric layer DL116 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figures 8, 9, 10:
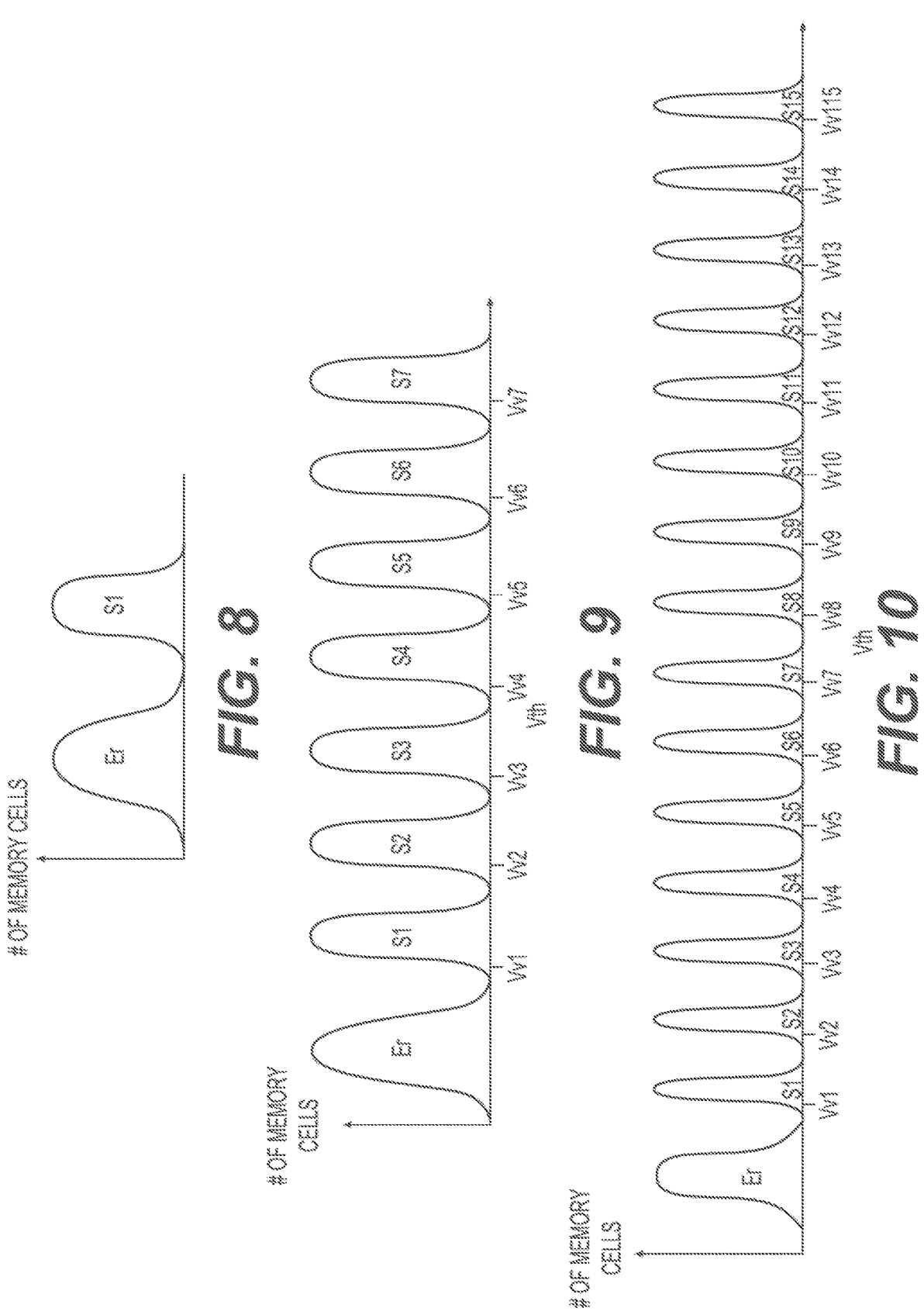
FIG. 8 depicts a threshold voltage distribution of a page of memory cells programmed to one bit per memory cell (SLC)
FIG. 9 depicts a threshold voltage distribution of a page of memory cells programmed to three bits per memory cell (TLC)
FIG. 10 depicts a threshold voltage distribution of a page of memory cells programmed to four bits per memory cell (QLC)

The memory cells of the memory blocks can be programmed to store one or more bits of data in multiple data states, each of which is associated with a respective threshold voltage Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a verify voltage (Vv1-Vv7), which is employed during a verify portion of a programming operation. FIG. 10 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states.

In some memory dies, the memory blocks may be configured to operate in multiple storage scheme modes, e.g., an SLC mode and a TLC mode or an SLC mode and a QLC mode. The memory device may then be configured to initially write data to memory blocks operating in an SLC mode, which offers high performance. Then, in a background operation when performance is not important, the memory device can program that data to a multi-bit per memory cell format for long-term storage.

Figure 11:
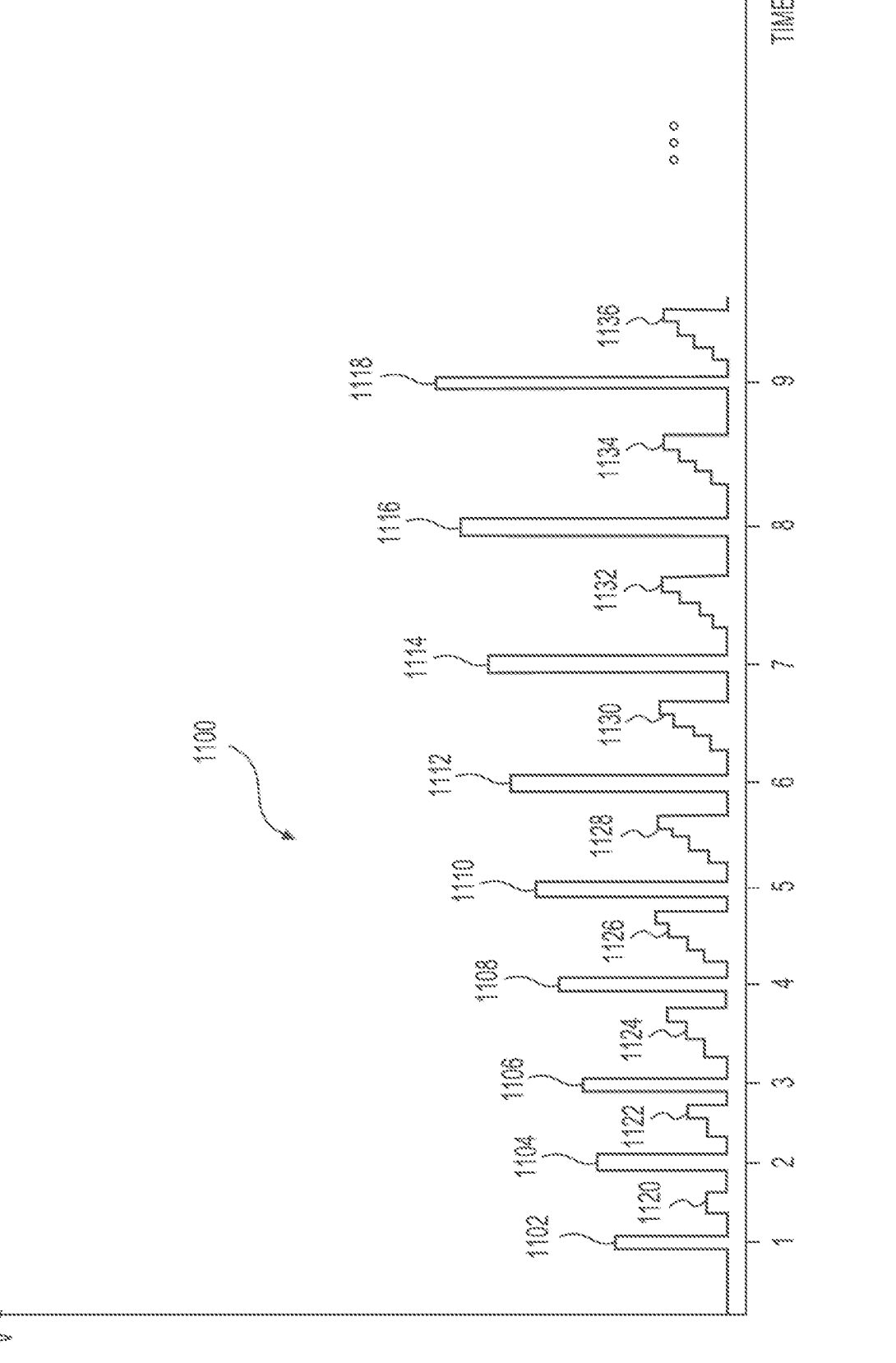
FIG. 11 depicts a voltage waveform of the voltage applied to a control gate of a selected word line during a programming operation.

Programming to multiple bits per memory cell typically includes a plurality of program loops. FIG. 11 depicts a waveform 1100 of the voltages applied to a selected word line during an example memory cell programming operation for programming the memory cells of the selected word line to a greater number of bits per memory cell (e.g., TLC or QLC). As depicted, each program loop includes a programming pulse VPGM and one or more verify pulses, depending on which data states are being programmed in a particular program loop. A square waveform is depicted for each pulse for simplicity: however, other shapes are possible, such as a multilevel shape or a ramped shape.

Incremental Step Pulse Programming (ISPP) is used in this example pulse train, which means that the VPGM pulse amplitude steps up, or increases, in each successive program loop. In other words, the pulse train includes VPGM pulses that increase stepwise in amplitude with each program loop using a fixed step size (dVPGM). A new pulse train starts with an initial VPGM pulse level VPGMU and ends at a final VPGM pulse level, which does not exceed a maximum allowed level. The pulse train 1100 includes a series of VPGM pulses 1101-1115 that are applied to a selected word line that includes a set of non-volatile memory cells. One or more verify voltage pulses 1116-1129 are provided after each VPGM pulse as an example, based on the target data states which are being verified in the program loop. The verify voltages correspond with voltages Vv1-VV7 (shown in FIG. 9). Concurrent with the application of the verify voltages, a sensing operation can determine whether a particular memory cell in the selected word line has a threshold voltage Vt above the verify voltage associated with its intended data state by sensing a current through the memory cell. If the current is relatively high, this indicates that the memory cell is in a conductive state, such that its threshold voltage Vt is less than the verify voltage. If the current is relatively low, this indicates that the memory cell is in a non-conductive state, such that its threshold voltage Vt is above the verify voltage. If the memory cell passes verify, programming of that memory cell is completed and further programming of that memory cell is inhibited for all remaining program loops by applying an inhibit voltage to a bit line coupled with the memory cell. Programming proceeds until all memory cells pass verify for their intended data states, in which case, programming passes, or until a predetermined maximum number of program loops is exceeded, in which case, programming fails. The memory cells of a word line can be divided into a series of string groups, or simply strings, that can be programmed independently of one another, and programming can commence from one string to another across the word line before proceeding to the next word line in the memory block.

Typically, for memory devices, read operations are higher priority than erase or program operations. For example, a program will be stopped to perform a read. To help illustrate, with reference to FIG. 12, during the program operation, a read operation is inserted at T1. Programming is, however, not immediately stopped. There is a latency before the read starts at T2. After the read, at T3, the program will resume. Therefore, Stop Read Go (SRG) latency between a read command being issued and a read operation being executed is critical for system performance. Generally, the shorter the latency the better.

During SRG, suspend latency is defined as the latency between sending of suspend command and the time a memory device is ready for suspend. In most of applications, less suspend latency is preferred. There are different settings for SRG. The settings may be identified by three features that are (1) how soon a suspend operation starts after a suspend command is received, (2) whether program verify is before suspend or after resume, and (3) what is the program voltage (VPGM) after resume.

Figures 12, 13:
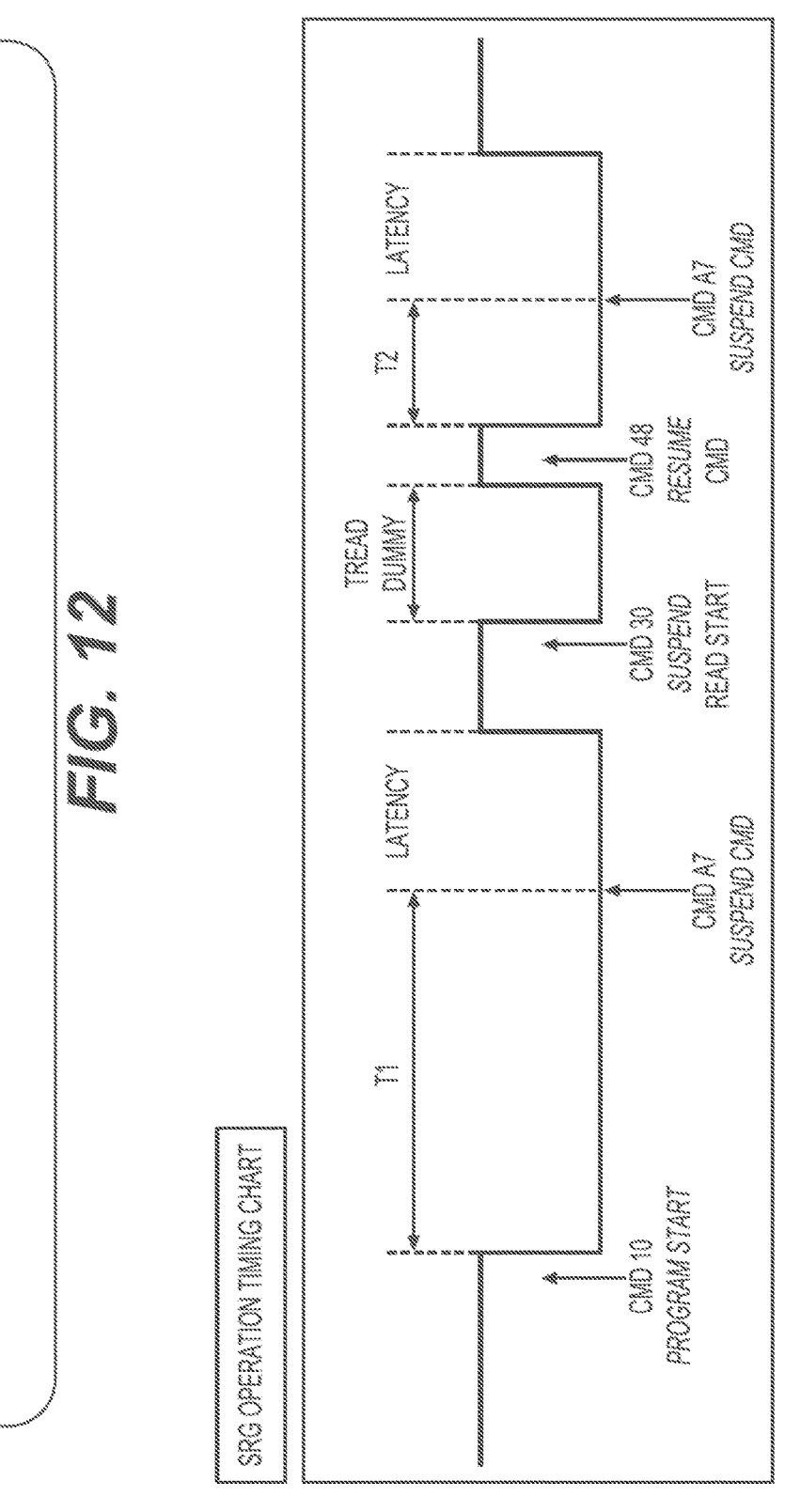
FIG. 12 illustrates Stop Read Go (SRG) operation.
FIG. 13 illustrates an SRG operation timing chart.

To help further explore the foregoing in further detail, FIG. 13 will now be described. FIG. 13 illustrates an SRG operation timing chart. In FIG. 13, T1 is the time between the program start on current word line/string and the first suspend command to kick in. In particular, suspend latency is the time between a suspend command (e.g., CMDA7) being sent and the memory device becoming ready. Typically, after suspending, one or multiple read operations are performed. After reading, a resume command (e.g., CMD48) is sent to resume programming. In FIG. 13, T2 is the program delay time between resume and suspend. Suspend Count (SC) is the number of suspend times per WL/string programming.

Each SRG setting has different latency and reliability issues. One SRG setting (hereinafter referred to as "SRG0") involves when a memory device receives a suspend command, the memory device cannot stop programming immediately to suspend. The suspend will not start until a current program loop and verify are finished. But for other SRG settings (hereinafter referred to as "SRG1" and "SRG2"), when a suspend command is received, a memory device can start suspending before the current program loop completes with verify being skipped. As such, for SRG1 and SRG2 settings, latency is the best. Still yet, in another SRG setting (hereinafter referred to as "SRG3") in which verify is skipped but the current program loop is finished before suspending, suspend latency is slightly worse than SRG1 and SRG2 settings.

Figure 14:
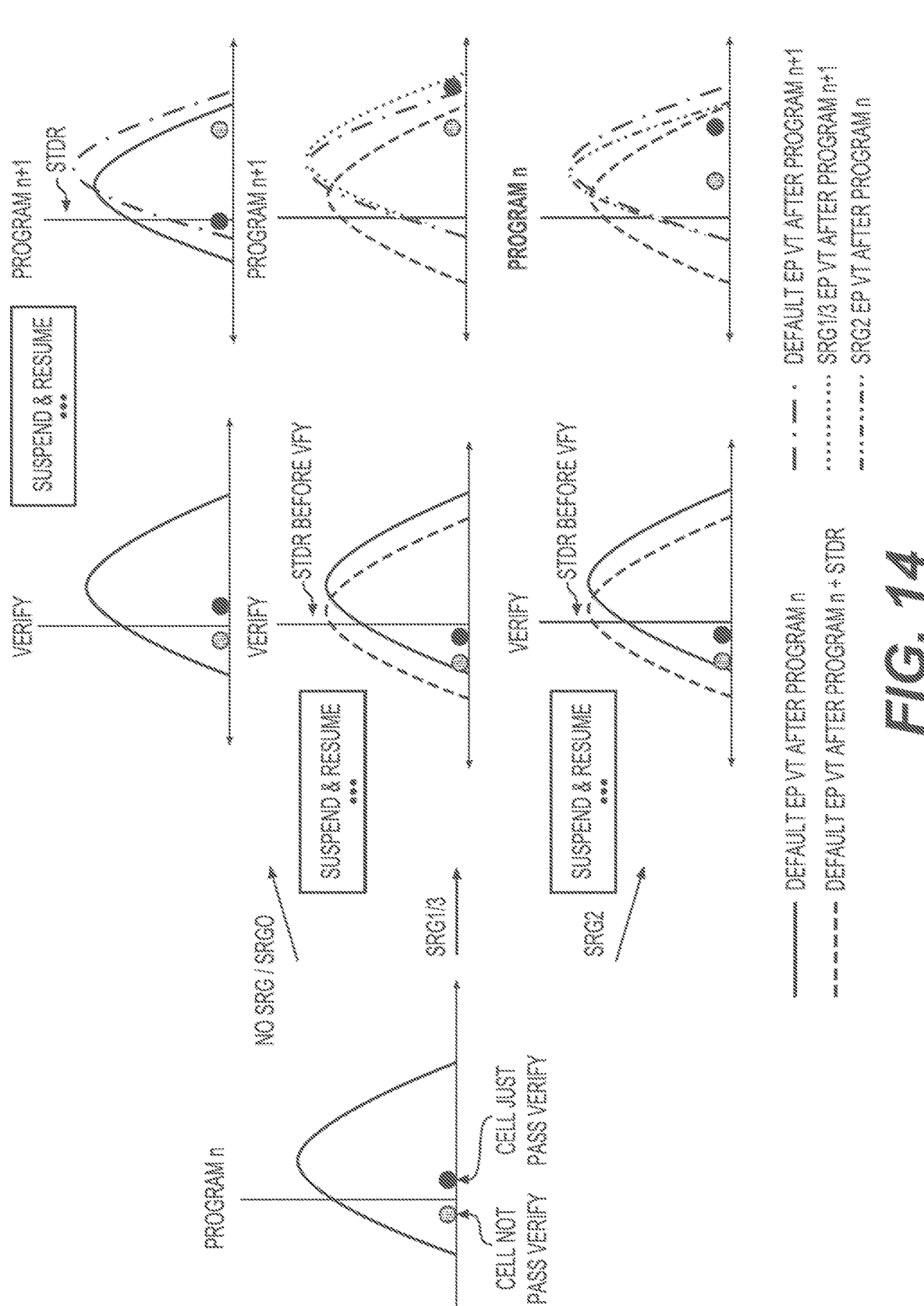
FIG. 14 depicts mechanism of suspend Vt shift for different SRG settings.

Another difference between these SRG settings is the VPGM voltage used after programming is resumed. To explore this further FIG. 14 will be now be referenced. FIG. 14 illustrates the mechanism of suspend Vt shift for different SRG settings. For SRG0/1/3, the VPGM steps up to VPGM of the next loop VPGM (n+1), while SRG2 maintains the same voltage VPGM(n) before suspending. This may cause overprogramming for SRG1/3. For example, in FIG. 14, assuming suspend happens during program loop n (with VPGM(n)), the solid dots represent the memory cells that just pass verify level before suspend. For regular program or suspend with SRG0, the memory cells should receive verifying and pass with verify immediately, thus the memory cells will be inhibited for future pulses. For SRG0/1/3, verify occurs after resume, where there is a delay between program and verify. Thus, the memory cells represented by the solid dot in FIG. 14 may lose their charge due to short term data retention (STDR), causing the voltage to be lower than the verify level when programming resumes. For SRG1/3, the VPGM after resume changes to VPGM(n+1), which means the memory cells represented by the solid dot in FIG. 14 will receive a higher VPGM voltage as compared to regular program or SRG0. As a result, the memory cells may be overprogrammed.

For SRG2 settings, after suspending at program loop n, it resumes programming with VPGM(n) of current program loop n without stepping up to the VPGM(n+1) voltage. As represented in FIG. 14, the memory cells represented by the solid dot, which just pass verify but down shift below the verify level due to STDR, will receive an additional program with VPGM(n) instead of VPGM (n+1). As a result, these memory cells will be programmed to a lower Vt than SRG1/3 with a step-up VPGM (n+1). The memory cells represented by the patterned dot in FIG. 14, which do not pass the verify level before suspending, will finish programming in the next program loop n+1 in regular program or with SRG0. For SRG2, the memory cells represented by the patterned dot could pass the verify level at program loop n because after resuming the memory cells will receive another pulse of VPGM(n), which is equivalent to having one longer VPGM(n) pulse for these memory cells. Compared to the memory cells represented as the patterned dot in regular program or with SRG0, which need an additional program loop of VPGM (n+1), the memory cells of SRG2 will be closer to the verify level. As a result, the final Vt of the corresponding state has a lower upper-tail and tighter Vt distribution, which benefits reliability.

Figure 15:
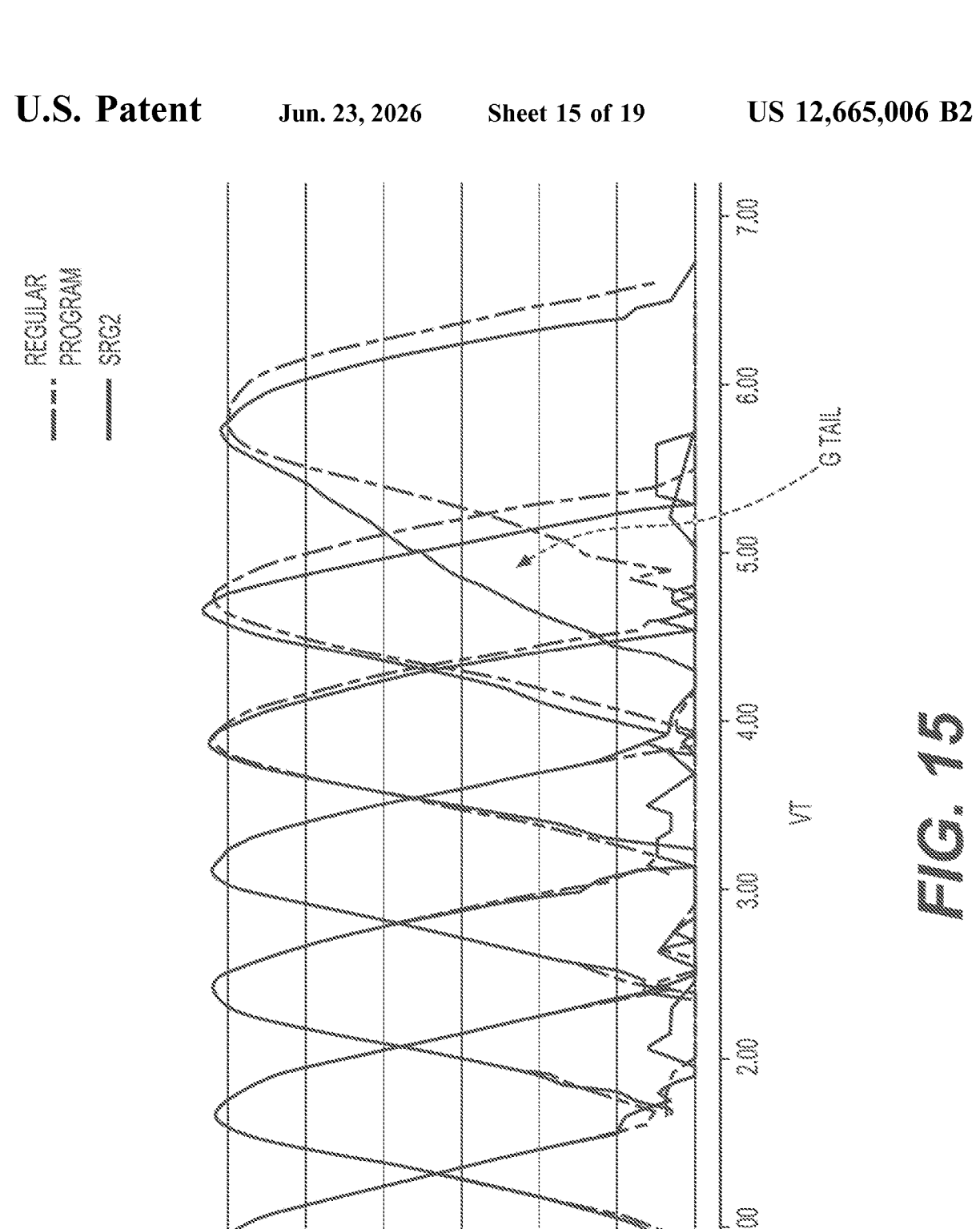
FIG. 15 depicts SRG lower tail downshift.

SRG2 provides for better suspend latency and for tighter Vt distributions than regular program Vt without suspend. Thus, reliability can improve after SRG2. However, with SRG2 setting, a G-state downshift may occur, which can impact reliability especially for data retention (DR). More specifically, as shown in FIG. 15, when F_STP_FINE is enabled, and multiple suspends are applied during 'F' state (e.g., S14 in FIG. 10) programming, the 'G' state (e.g., S15 in FIG. 10) downshift is observed.

Figure 16:
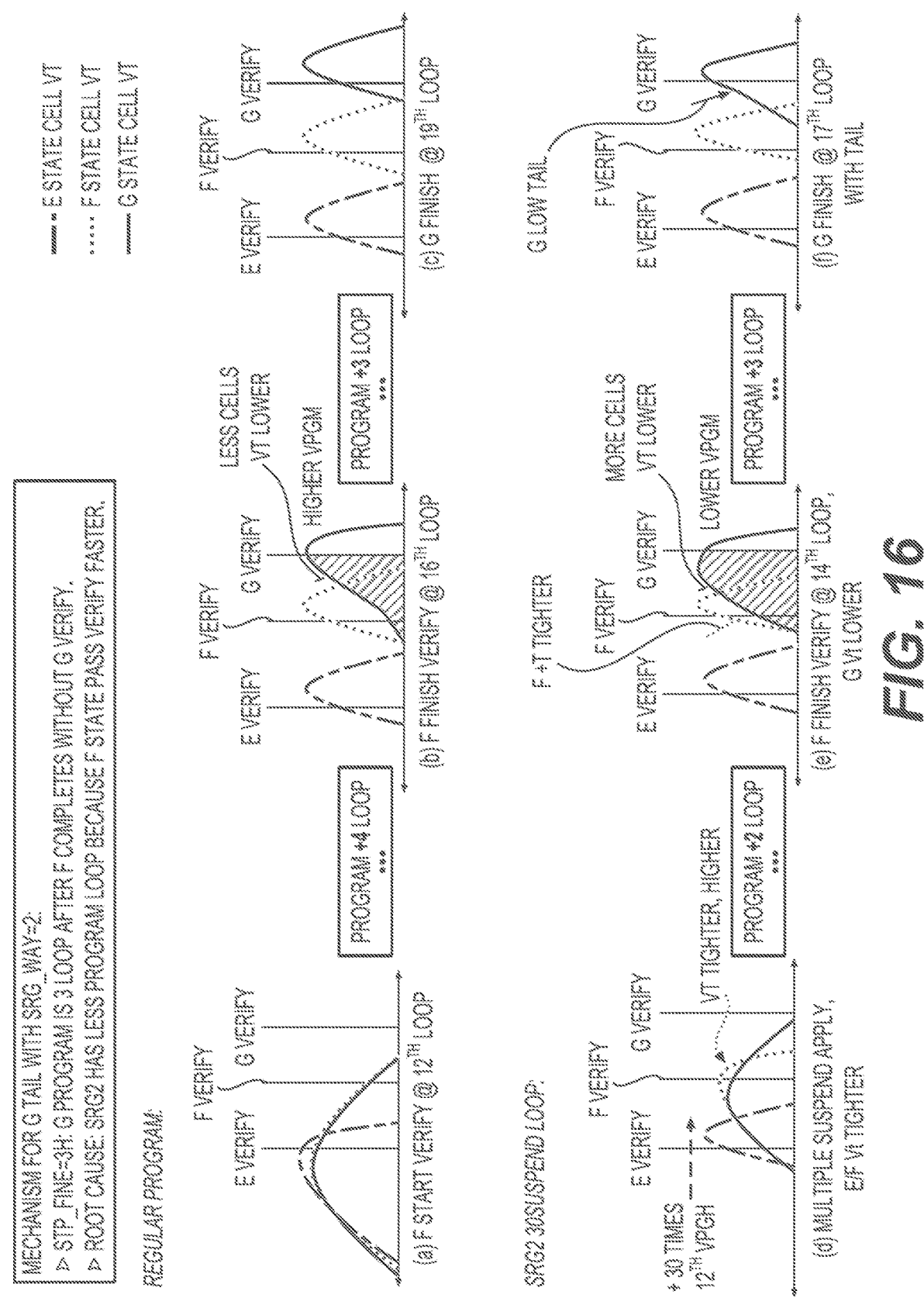
FIG. 16 depicts SRG lower tail downshift.

STP_FINE is a scheme to increase the program speed by skipping the 'G' state verify. The scheme involves automatically adding one to three extra program loops (e.g., depending if F_STP_FINE=1/2/3) after 'F' state verify completes, without the last verify of final program loop. FIG. 16 illustrates 'G' state downshift of SRG2 with F_STP_FINE enabled. For example, at (a) in FIG. 16, for regular program, 'F' state cells start programming and verify at the twelfth program loop. Further, at (b) in FIG. 16, 'F' state cells finish programming and verify at the sixteenth program loop. At (c) in FIG. 16, with F_STP_FINE set to three, 'G' state cells finish programing at the nineteenth program loop. For SRG2, when multiple suspends are applied in same loop during 'F' programming, 'E' (e.g., S13 in FIG. 10) and 'F' states have unfinished cells that will receive multiple program pluses with VPGM (12th), which is equivalent to longer VPGM (12th) pulse. Thus, at (d) in FIG. 16, at end of the twelfth loop, Vt of states 'E', 'F', and 'G' become higher than regular program. Based on higher Vt, 'F' state program will complete with less program loops, for example, decreasing from additional four program loops of regular program to two program loops to pass 'F' verify, as shown at (e) in FIG. 16. A portion of the 'G' state cells Vt will be lower than regular program. Therefore, with F_STP_FINE set to three, the 'G' state final VPGM may be lower than regular program, which provides insufficient program voltage to push the slow cells to the target level, thereby forming a 'G' state low tail on Vt distribution, as shown at (f) at FIG. 16.

Embodiments disclosed herein are directed to several methods capable of addressing the issues described above. For example, these methods include (1) disabling F_STP_FINE (e.g., by setting F_STP_FINE=0), (2) limiting a number of suspends allowed during each word line/string program, and (3) setting a minimum time period between suspend operations to being longer than one program loop plus verify.

For the first method, by disabling F_STP_FINE, the slow memory cells of 'G' state cannot pass verify and extra program loops will be added until the memory cells meet the target voltage. Thus, 'G' tail disappears. However, there is a performance penalty because 'G' state verify will be needed regardless if SRG is applied or not. In some embodiments, G state verify may be performed only when suspend has occurred.

Figure 17:
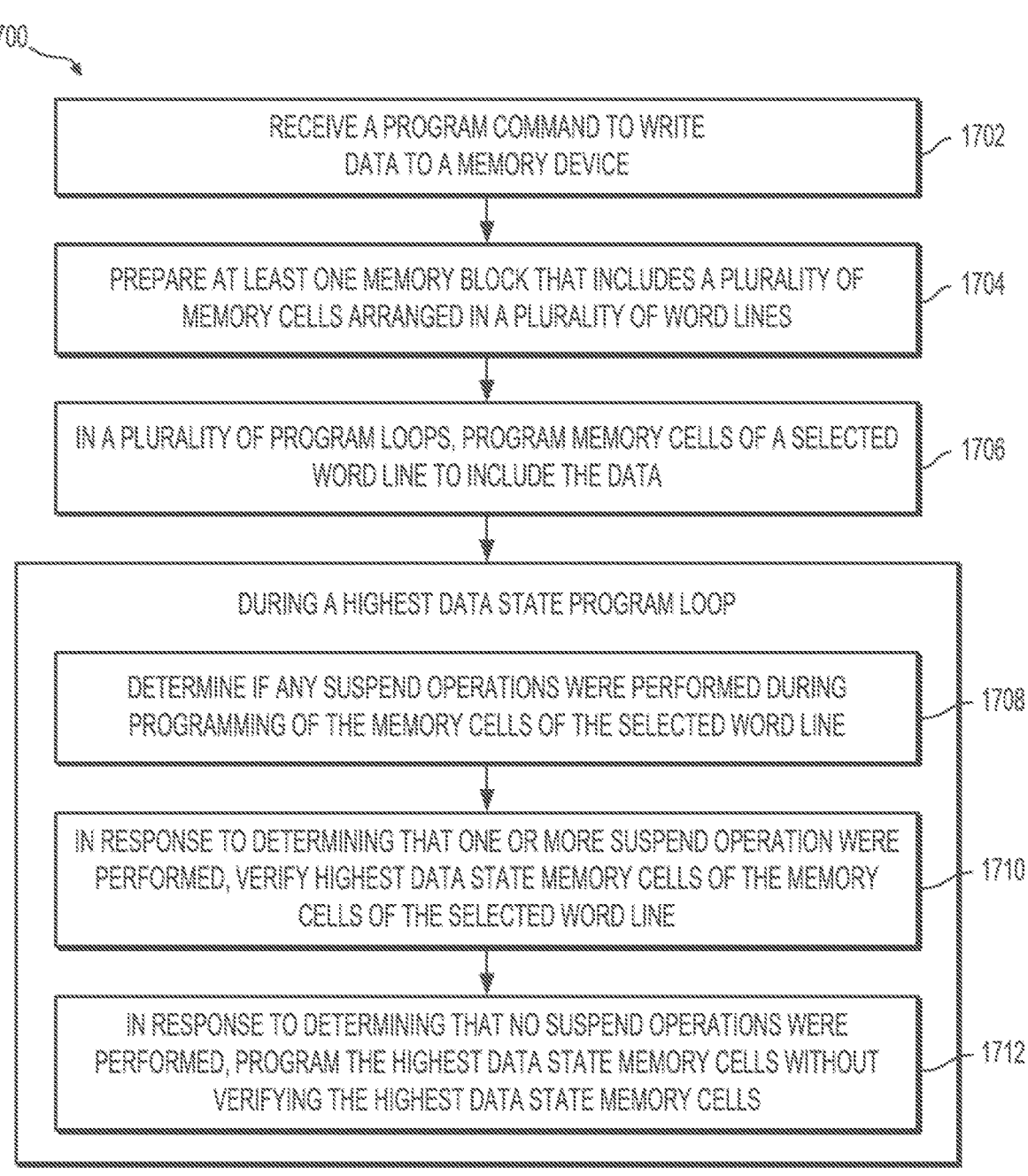
FIG. 17 depicts a method of performing a highest state verify only after a suspend has occurred, in accordance with embodiments described herein.

To help further illustrate, FIG. 17 will be described. FIG. 17 depicts a method 1700 of performing a highest state verify only after a suspend has occurred, in accordance with embodiments described herein. In some embodiments, method 1700 may be implemented by a controller, control circuitry, a processor, and/or the like, as described elsewhere herein. As shown in FIG. 17, method 1700 starts at step 1702. In step 1702, a program command to write data to a memory device is received. For example, with reference to FIGS. 1A and 1B, control circuitry 110 may receive a program command to write data to a memory device.

In FIG. 17, in step 1704, at least one memory block that includes a plurality of memory cells arranged in a plurality of word lines is prepared. For example, with reference to FIGS. 1A and 1B, control circuitry 110 may prepare at least one memory block that includes a plurality of memory cells arranged in a plurality of word lines.

In FIG. 17, in step 1706, in a plurality of program loops, memory cells of a selected word line are programmed to include the data. For example, with reference to FIGS. 1A and 1B, control circuitry 110 may, in a plurality of program loops, program memory cells of a selected word line to include the data.

In FIG. 17, steps 1708, 1710, and 1712 are performed during a highest data state program loop. For example, in FIG. 17, in step 1708, it is determined if any suspend operations were performed during programming of the memory cells of the selected word line. For example, with reference to FIGS. 1A and 1B, control circuitry 110 may determines if any suspend operations were performed during programming of the memory cells of the selected word line.

In FIG. 17, in step 1710, in response to determining that one or more suspend operation were performed, highest data state memory cells of the memory cells of the selected word line are verified. For example, with reference to FIGS. 1A and 1B, control circuitry 110 may, in response to determining that one or more suspend operation were performed, verify highest data state memory cells of the memory cells of the selected word line.

In FIG. 17, in step 1712, in response to determining that no suspend operations were performed, the highest data state memory cells are programmed without verifying the highest data state memory cells. For example, with reference to FIGS. 1A and 1B, control circuitry 110 may, in response to determining that no suspend operations were performed, program the highest data state memory cells without verifying the highest data state memory cells.

In another method, a number of suspends allowed may be limited during each word line/string program (e.g., SC not being more than 20). In this method, the object is to shorten the equivalent programming time of loop n to make sure the total number of program loop is comparable to regular programming. In some embodiments, the exact number of suspends allowed may be characterized using suspend count shmoo under the worst case scenario, which is applying multiple suspends during the same loop of 'F' state program to determine the threshold where F-G Vt margin with SRG is comparable with regular programming. Limiting the number of suspends may reduce 'G' state tail.

To help further illustrate, FIG. 18 will be described. FIG. 18 depicts a method 1800 of limiting a number of suspends allowed during each word line/string program, in accordance with embodiments described herein. In some embodiments, method 1800 may be implemented by a controller, control circuitry, a processor, and/or the like, as described elsewhere herein. As shown in FIG. 18, method 1800 starts at step 1802. In step 1802, a program command to write data to a memory device is received. For example, with reference to FIGS. 1A and 1B, control circuitry 110 may receive a program command to write data to a memory device.

In FIG. 18, in step 1804, at least one memory block that includes a plurality of memory cells arranged in a plurality of word lines is prepared. For example, with reference to FIGS. 1A and 1B, control circuitry 110 may prepare at least one memory block that includes a plurality of memory cells arranged in a plurality of word lines.

In FIG. 18, in step 1806, in a plurality of program loops, memory cells of a selected word line are programmed to include the data. For example, with reference to FIGS. 1A and 1B, control circuitry 110 may, in a plurality of program loops, program memory cells of a selected word line to include the data.

In FIG. 18, in step 1808, a suspend command to suspend programming of the memory cells of the selected word line is received. For example, with reference to FIGS. 1A and 1B, control circuitry 110 may receive a suspend command to suspend programming of the memory cells of the selected word line.

In FIG. 18, in step 1810, a number of suspend operations that were performed during programming of the memory cells of the selected word line is determined. For example, with reference to FIGS. 1A and 1B, control circuitry 110 may determine a number of suspend operations that were performed during programming of the memory cells of the selected word line.

In FIG. 18, in step 1812, in response to determining that the number of suspend operations performed is higher than or equal to a threshold of maximum number of allowed suspend operations during a program operation, programming of the memory cells of the selected word line in a current program loop of the plurality of program loops is continued. For example, with reference to FIGS. 1A and 1B, control circuitry 110 may, in response to determining that the number of suspend operations performed is higher than or equal to a threshold of maximum number of allowed suspend operations during a program operation, continue programming of the memory cells of the selected word line in a current program loop of the plurality of program loops.

In FIG. 18, in step 1814, in response to determining that the number of suspend operations performed is less than the threshold of maximum number of allowed suspend operations during a program operation, programming of the memory cells of the selected word line in the current program loop is suspended. For example, with reference to FIGS. 1A and 1B, control circuitry 110 may, in response to determining that the number of suspend operations performed is less than the threshold of maximum number of allowed suspend operations during a program operation, suspend programming of the memory cells of the selected word line in the current program loop.

Another method is directed to setting a minimum time period between suspend operations to being longer than one program loop plus verify. This can limit the maximum number of suspends per program loop to one. For example, when resume to suspend time is longer than a time period (e.g., 200 μs), the following suspend will not be at the same program loop of a current suspend, if each program loop plus verify is less than 200 μs. As a result, the accumulative effect of VPGM(n) is minimized.

To help further illustrate, FIG. 19 will be described. FIG. 19 depicts a method 1900 of setting a minimum time period between suspend operations, in accordance with embodiments described herein. In some embodiments, method 1900 may be implemented by a controller, control circuitry, a processor, and/or the like, as described elsewhere herein. As shown in FIG. 19, method 1900 starts at step 1902. In step 1902, a program command to write data to a memory device is received. For example, with reference to FIGS. 1A and 1B, control circuitry 110 may receive a program command to write data to a memory device.

In FIG. 19, in step 1904, at least one memory block that includes a plurality of memory cells arranged in a plurality of word lines is prepared. For example, with reference to FIGS. 1A and 1B, control circuitry 110 may prepare at least one memory block that includes a plurality of memory cells arranged in a plurality of word lines.

In FIG. 19, in step 1906, in a plurality of program loops, memory cells of a selected word line are programmed to include the data. For example, with reference to FIGS. 1A and 1B, control circuitry 110 may, in a plurality of program loops, program memory cells of a selected word line to include the data.

In FIG. 19, in step 1908, a suspend command to suspend programming of the memory cells of the selected word line is received. For example, with reference to FIGS. 1A and 1B, control circuitry 110 may receive a suspend command to suspend programming of the memory cells of the selected word line.

In FIG. 19, in step 1910, a period of time between performance of a previous resume operation and receipt of the suspend command is determined. For example, with reference to FIGS. 1A and 1B, control circuitry 110 may determine a period of time between performance of a previous suspend operation and receipt of the suspend command.

In FIG. 19, in step 1912, in response to determining that the period of time is longer than or equal to a threshold of minimum time between performing suspend operations, programming of the memory cells of the selected word line in a current program loop is suspended. For example, with reference to FIGS. 1A and 1B, control circuitry 110 may, in response to determining that the period of time is longer than or equal to a threshold of minimum time between performing suspend operations, suspend programing of the memory cells of the selected word line in a current program loop.

In FIG. 19, in step 1914, in response to determining that the period of time is shorter than the threshold of minimum time between performing suspend operations, programming of the memory cells of the selected word line in the current program loop is continued. For example, with reference to FIGS. 1A and 1B, control circuitry 110 may, in response to determining that the period of time is shorter than a threshold of minimum time between performing suspend operations, continue programming of the memory cells of the selected word line in the current program loop.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:

receiving a program command to write data to the memory device;

preparing at least one memory block that includes a plurality of memory cells arranged in a plurality of word lines;

in a plurality of program loops, programming memory cells of a selected word line to include the data;

receiving a suspend command to suspend programming of the memory cells of the selected word line;

setting a maximum number of allowed suspend operations during a program operation based on a threshold voltage downshift for a highest programmed voltage state of the plurality of memory cells;

determining a number of suspend operations that were performed during programming of the memory cells of the selected word line; and in response to determining that the number of suspend operations performed is higher than or equal to the maximum number of allowed suspend operations during a program operation, continuing programming of the memory cells of the selected word line in a current program loop of the plurality of program loops.

2. The method as set forth in claim 1, further including the step of:

in response to determining that the number of suspend operations performed is less than the maximum number of allowed suspend operations during a program operation, suspending programming of the memory cells of the selected word line in the current program loop.

3. The method as set forth in claim 1, wherein the maximum number of allowed suspend operations is 20.

4. The method as set forth in claim 1, wherein the maximum number of allowed suspend operations is selected based on the threshold voltage downshift caused by performing multiple suspend operations during a programming operation of a programmed voltage state adjacent to the highest programmed voltage state.

5. The method set forth in claim 4, wherein the maximum number of allowed suspend operations is selected further based on a threshold voltage margin between the highest programmed voltage state and the programmed voltage state adjacent to the highest programmed voltage state.

6. The method of set forth in claim 1, wherein receiving the suspend command includes receiving the suspend command to initiate a Stop Read Go (SRG) operation.

* * * * *